(12) United States Patent
Whitney et al.

(10) Patent No.: US 6,549,114 B2
(45) Date of Patent: *Apr. 15, 2003

(54) PROTECTION OF ELECTRICAL DEVICES WITH VOLTAGE VARIABLE MATERIALS

(75) Inventors: Stephen J. Whitney, Lake Zurich, IL (US); Louis Rector, Allegany, NY (US); Hugh M. Hyatt, Bremerton, WA (US); Anthony D. Minervini, Orland Park; Honorio S. Luciano, Elk Grove Village, both of IL (US)

(73) Assignee: Littelfuse, Inc., Des Plaines, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/379,422

(22) Filed: Aug. 19, 1999

(65) Prior Publication Data

US 2002/0050910 A1 May 2, 2002

Related U.S. Application Data

(60) Provisional application No. 60/097,314, filed on Aug. 20, 1998.

(51) Int. Cl.[7] .................................................. H01L 7/10
(52) U.S. Cl. ............................ 338/21; 338/13; 338/20; 439/181; 361/127; 361/782
(58) Field of Search .............................. 338/13, 20, 21, 338/260, 261; 439/181; 361/56, 126, 127, 782

(56) References Cited

U.S. PATENT DOCUMENTS

| 2,273,704 | A |   | 2/1942 | Grisdale |
| 3,685,026 | A |   | 8/1972 | Wakabayashi et al. |
| 3,685,028 | A |   | 8/1972 | Wakabayashi et al. |
| 3,743,897 | A |   | 7/1973 | Harnden, Jr. |
| 3,916,366 | A | * | 10/1975 | Jefferson ..................... 338/21 |
| 4,045,712 | A |   | 8/1977 | DeTommasi |
| 4,252,692 | A |   | 2/1981 | Taylor et al. |

(List continued on next page.)

FOREIGN PATENT DOCUMENTS

| CH | 663 491 A5 | 12/1987 |
| EP | 0 625 808 A1 | 11/1994 |
| WO | WO 97/21230 | 12/1996 |
| WO | PCT/US 98/23493 | 11/1998 |

OTHER PUBLICATIONS

European Search Report dated May 15, 2000 for EP 99 0 6620.
European Search Report—Apr. 22, 1999.

Primary Examiner—Karl D. Easthom
(74) Attorney, Agent, or Firm—Bell, Boyd & Lloyd LLC (57) ABSTRACT

An arrangement of voltage variable materials for the protection of electrical components from electrical overstress (EOS) transients. A device having a plurality of electrical leads, a ground plane and a layer of voltage variable material. The voltage variable material physically bonds the plurality of electrical leads to one another as well as provides an electrical connection between the plurality of electrical leads and the ground plane. A die having a circuit integrated therein is attached to the ground plane. Conductive members electrically connect the plurality of electrical leads to the integrated circuit. At normal operating voltages, the voltage variable material has a high resistance, thus channeling current from the electrical leads to the integrated circuit via the conductive members. In response to a high voltage EOS transient, the voltage variable material essentially instantaneously switches to a low resistance state, channeling the potentially harmful EOS transient to the ground plane and away from the integrated circuit.

20 Claims, 5 Drawing Sheets

U.S. PATENT DOCUMENTS

| | | |
|---|---|---|
| 4,331,948 A | 5/1982 | Malinaric et al. |
| 4,359,414 A | 11/1982 | Mastrangelo |
| 4,559,579 A | 12/1985 | Val |
| 4,726,991 A | 2/1988 | Hyatt et al. |
| 4,928,199 A | 5/1990 | Diaz et al. |
| 4,977,357 A | 12/1990 | Shrier |
| 4,992,333 A | 2/1991 | Hyatt |
| 5,068,634 A | 11/1991 | Shrier |
| 5,099,380 A | 3/1992 | Childers et al. |
| 5,142,263 A | 8/1992 | Childers et al. |
| 5,183,698 A | 2/1993 | Stephenson et al. |
| 5,189,387 A | 2/1993 | Childers et al. |
| 5,246,388 A | 9/1993 | Collins et al. |
| 5,248,517 A | 9/1993 | Shrier et al. |
| 5,260,848 A | 11/1993 | Childers |
| 5,262,754 A | 11/1993 | Collins |
| 5,273,815 A | 12/1993 | Brydon et al. |
| 5,278,535 A | 1/1994 | Xu et al. |
| 5,294,374 A | 3/1994 | Martinez et al. |
| 5,335,137 A | 8/1994 | English et al. |
| 5,340,641 A | 8/1994 | Xu |
| 5,386,335 A * | 1/1995 | Amano et al. ................ 338/21 |
| 5,393,597 A | 2/1995 | Childers et al. |
| 5,476,714 A | 12/1995 | Hyatt |
| 5,508,224 A | 4/1996 | Jang |
| 5,510,947 A | 4/1996 | Pellegini et al. |
| 5,545,910 A | 8/1996 | Jang |
| 5,646,434 A | 7/1997 | Chrysostomides et al. |
| 5,669,381 A | 9/1997 | Hyatt |
| 5,707,886 A | 1/1998 | Consiglio et al. |
| 5,756,007 A | 5/1998 | Franey |
| 5,777,368 A | 7/1998 | Wu et al. |
| 5,781,395 A | 7/1998 | Hyatt |
| 5,796,570 A | 8/1998 | Mekdhanasarn et al. |
| 5,807,509 A | 9/1998 | Shrier et al. |
| 5,889,308 A * | 3/1999 | Hong et al. ................ 257/311 |
| 5,973,588 A * | 10/1999 | Cowman et al. ............. 338/21 |
| 6,018,299 A * | 1/2000 | Eberhardt ............... 340/572.7 |
| 6,087,923 A * | 7/2000 | Ahn et al. .................... 338/21 |
| 6,239,687 B1 * | 5/2001 | Shrier et al. ................. 338/21 |

* cited by examiner

PROTECTION OF ELECTRICAL DEVICES WITH VOLTAGE VARIABLE MATERIALS

CROSS-REFERENCE TO RELATED APPLICATIONS

This application claims the benefit of U.S. Provisional Application No. 60/097,314 filed on Aug. 20, 1998, the disclosure of which is incorporated herein by reference.

TECHNICAL FIELD

The present invention generally relates to the use of voltage variable materials for the protection of electronic components against electrical overstress (EOS) transients.

BACKGROUND OF THE INVENTION

Figure 1:
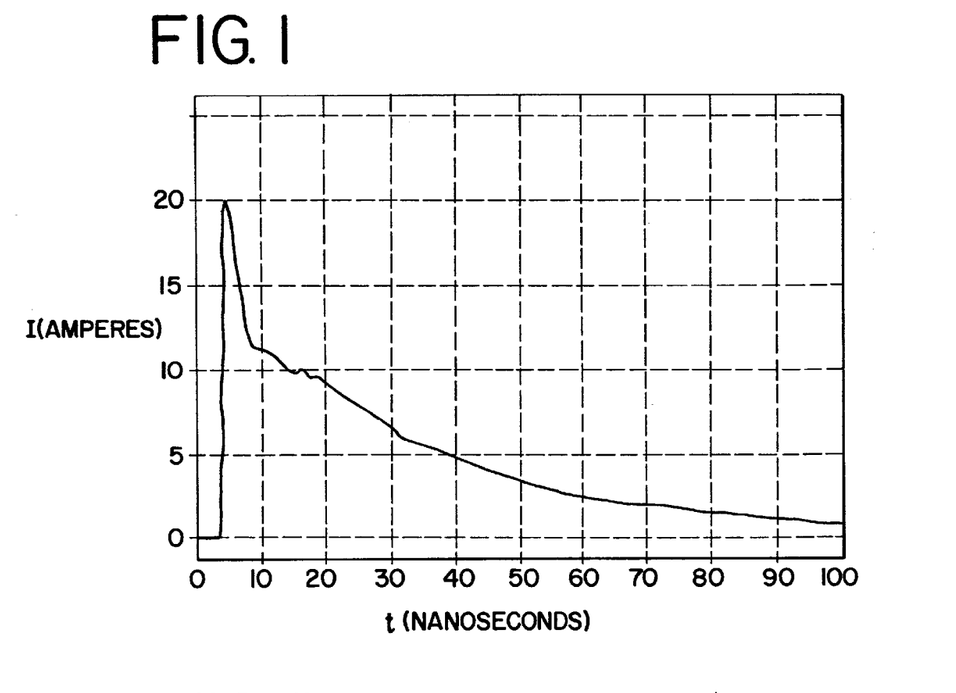
FIG. 1 graphically illustrates a typical current waveform of an EOS transient.

There is an increased demand for materials and electrical components which can protect electronic circuits from EOS transients which produce high electric fields and usually high peak powers capable of destroying circuits or the highly sensitive electrical components in the circuits, rendering the circuits and the components non-functional, either temporarily or permanently. The EOS transient can include transient voltage or current conditions capable of interrupting circuit operation or destroying the circuit outright. Particularly, EOS transients may arise, for example, from an electromagnetic pulse, an electrostatic discharge, lightening, or be induced by the operation of other electronic or electrical components. Such transients may rise to their maximum amplitudes in microsecond to subnanosecond time frames and may be repetitive in nature. A typical waveform of an electrical overstress transient is illustrated in FIG. 1. The peak amplitude of the electrostatic discharge (ESD) transient wave may exceed 25,000 volts with currents of more than 100 amperes. There exist several standards which define the waveform of the EOS transient. These include IEC 1000-4-2, ANSI guidelines on ESD (ANSI C63.16), DO-160, and FAA-20-136. There also exist military standards, such as MIL STD 461 and MIL STD 883 part 3015.

Materials for the protection against EOS transients (EOS materials) are designed to respond essentially instantaneously (i.e., ideally before the transient wave reaches its peak) to reduce the transmitted voltage to a much lower value and clamp the voltage at the lower value for the duration of the EOS transient. EOS materials are characterized by high electrical resistance values at low or normal operating voltages and currents. In response to an EOS transient, the material switches essentially instantaneously to a low electrical resistance value. When the EOS threat has been mitigated these materials return to their high resistance value. These materials are capable of repeated switching between the high and low resistance states, allowing circuit protection against multiple EOS events. EOS materials are also capable of recovering essentially instantaneously to their original high resistance value upon termination of the EOS transient. For purposes of this application, the high resistance state will be referred to as the "off-state" and the low resistance state will be referred to as the "on-state."

Figure 2:
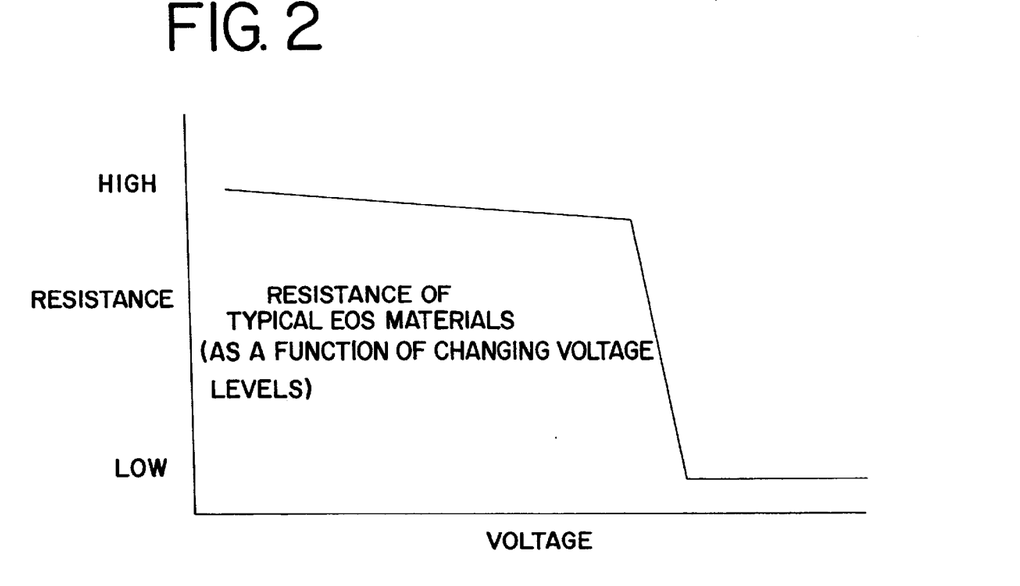
FIG. 2 graphically illustrates the electrical resistance versus d.c. voltage relationship of typical EOS materials.

FIG. 2 illustrates a typical electrical resistance versus d.c. voltage relationship for EOS materials. Circuit components including EOS materials can shunt a portion of the excessive voltage or current due to the EOS transient to ground, thus, protecting the electrical circuit and its components. The major portion of the threat transient is reflected back towards the source of the threat. The reflected wave is either attenuated by the source, radiated away, or re-directed back to the surge protection device which responds with each return pulse until the threat energy is reduced to safe levels.

In particular, the present invention is directed to the application of voltage variable materials to electrical devices to provide protection against EOS transients. Accordingly, any of the following EOS materials and methods for making EOS materials can be used in the present invention, the disclosures of which are incorporated herein by reference.

U.S. Provisional Patent Application No. 60/064,963 discloses compositions for providing protection against EOS. The compositions include a matrix formed of a mixture of an insulating binder, conductive particles having an average particle size of less than 10 microns, and semiconductive particles having an average particle size of less than 10 microns. The compositions utilizing relatively small particle sized conductive and semiconductive fillers exhibit clamping voltages in a range of about 30 volts to about 2,000 volts or greater.

U.S. Pat. No. 2,273,704, issued to Grisdale, discloses granular composites which exhibit non-linear current voltage relationships. These mixtures are comprised of granules of conductive and semiconductive granules that are coated with a thin insulative layer and are compressed and bonded together to provide a coherent body.

U.S. Pat. No. 2,796,505, issued to Bocciarelli, discloses a non-linear voltage regulating element. The element is comprised of conductor particles having insulative oxide surface coatings that are bound in a matrix. The particles are irregular in shape and make point contact with one another.

U.S. Pat. No. 4,726,991, issued to Hyatt et al., discloses an EOS protection material comprised of a mixture of conductive and semiconductive particles, all of whose surfaces are coated with an insulative oxide film. These particles are bound together in an insulative binder. The coated particles are preferably in point contact with each other and conduct preferentially in a quantum mechanical tunneling mode.

U.S. Pat. No. 5,476,714, issued to Hyatt, discloses EOS composite materials comprised of mixtures of conductor and semiconductor particles in the 10 to 100 micron range with a minimum proportion of 100 angstrom range insulative particles, bonded together in a insulative binder. This invention includes a grading of particle sizes such that the composition causes the particles to take a preferential relationship to each other.

U.S. Pat. No. 5,260,848, issued to Childers, discloses foldback switching materials which provide protection from transient overvoltages. These materials are comprised of mixtures of conductive particles in the 10 to 200 micron range. Semiconductor and insulative particles are also employed in these compositions. The spacing between conductive particles is at least 1000 angstroms.

Additional EOS polymer composite materials are also disclosed in U.S. Pat. Nos. 4,331,948, 4,726,991, 4,977,357, 4,992,333, 5,142,263, 5,189,387, 5,294,374, 5,476,714, 5,669,381, and 5,781,395, the teachings of which are specifically incorporated herein by reference.

SUMMARY OF THE INVENTION

It is an object of the present invention to apply voltage variable materials to numerous different configurations of electrical devices to provide protection from EOS transients. In a first embodiment of the present invention, an electrical device (e.g., a chip comprising an integrated circuit) comprises a plurality of electrical leads, a ground plane and a layer of voltage variable material. Each electrical lead is spaced apart from the other electrical leads and the ground plane. The layer of voltage variable material fills the spacing between the electrical leads and the ground plane, physically connecting the electrical leads and the ground plane.

The device can be manufactured by providing a lead frame having a plurality of electrical leads and a ground plane. There is a predetermined spacing, A, between each electrical lead and a predetermined spacing, B, between each lead and the ground plane. A voltage variable material is applied to the lead frame such that the material fills the spacing, A, between the leads and the spacing, B, between each lead and the ground plane. The voltage variable material physically connects the plurality of leads to the ground plane. A die or integrated circuit is mounted on the ground plane. The leads are then electrically connected to the integrated circuit. The plurality of electrical leads, ground plane and die are encapsulated in a protective coating leaving a portion of the plurality of leads exposed. The exposed portion of the leads are then formed into connector pins. The advantage of such a device and method is: (1) the need for a separate substrate to accommodate the voltage variable material, electrical leads, ground plane and die is eliminated; (2) protection from EOS transients is built into the existing structure of the electrical device, thus, conserving real estate on a printed circuit board; and (3) the voltage variable material can be applied to a variety of device configurations.

In another embodiment of the present invention, the voltage variable material forms a tape upon which a circuit is built up to form the electrical device. Starting with a layer of voltage variable material, a first electrode is attached to a first side of the layer and a second electrode is attached to a second side of the layer. The electrodes can be a metal foil or a metal layer attached by any conventional method (e.g., lamination, electroless plating, electrolytic plating, vapor deposition). The electrodes are then processed by masking/etching or photo lithographic methods (as disclosed in U.S. Pat. No. 5,699,607 and incorporated herein by reference) to form a laminate comprised of a ground plane and a plurality of electrical leads on the layer of voltage variable material. The layer of voltage variable material is then cured and pressure is applied to the laminate to form the final integrated tape device. In order to provide mechanical stability to the device during the processing of the electrodes, the voltage variable material may be cured prior to the step of processing the electrodes.

In yet another embodiment of the present invention, a hybrid tape of voltage variable material is simply bonded to an existing lead frame to provide protection against EOS transients. The lead frame includes a plurality of electrical leads electrically connected to die having a circuit integrated therein. The die is attached to a conductive die connector plate. The hybrid tape is comprised of a layer of voltage variable material with a first conductive layer disposed on one side thereof. The other side of the layer of voltage variable material is bonded to the lead frame, physically connecting the plurality of electrical leads to the die connector plate. The plurality of electrical leads are then trimmed from the lead frame to produce the electrical device.

In a further embodiment of the present invention, a layer of voltage variable material has a conductive adhesive applied to a first side. The adhesive has a anisotropic voltage breakdown. A conductive layer (e.g., metal foil or electroless layer of copper) is applied to a second side of the layer of voltage variable material to form a tape. Preferably, the conductive adhesive collapses to a very thin layer when bonded to an object (e.g, a lead frame or pin-style electrical connection of an electrical device to a trace on a printed circuit board).

In still another embodiment of the present invention, the electrical device comprises a hollow conductive tube having a layer of voltage variable material disposed on the outer surface thereof. The electrical device is especially well suited for providing protection between the electrical leads of a connector housing. The device is placed between a first set of a plurality of electrical leads and a second set of a plurality of electrical leads, with the layer of voltage variable material contacting both the first and second sets of plurality of leads and the conductive tube being electrically grounded.

In another embodiment of the present invention, an integrated circuit is encapsulated in a protective housing comprised of a voltage variable material. The protective housing bonds the individual components of the circuit together, protects the integrated circuit from undesired external influences (mechanical and electrical), and electrically protects the integrated circuit from EOS transients.

In a final embodiment of the present invention, the housing of an electrical connector is composed of a voltage variable material. The material is applied between the electrical connectors to which an EOS transient may be applied and the ground reference of the electrical connectors.

Other advantages and aspects of the present invention will become apparent upon reading the following description of the drawings and detailed description of the invention.

DETAILED DESCRIPTION OF THE INVENTION

While this invention is susceptible of embodiment in many different forms, there is shown in the drawings and will herein be described in detail a preferred embodiment of the invention with the understanding that the present disclosure is to be considered as an exemplification of the principles of the invention and is not intended to limit the broad aspect of the invention to the embodiments illustrated.

Figures 13, 14:
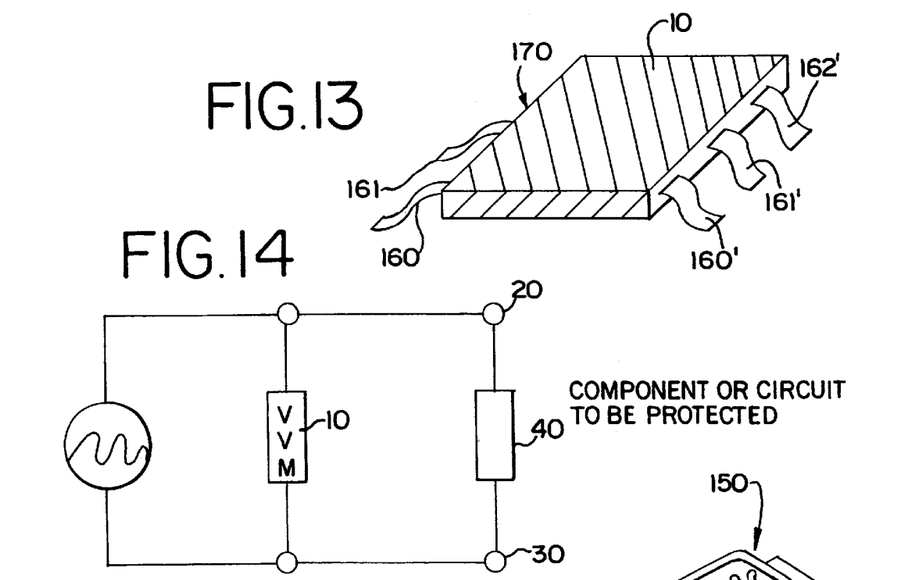
FIG. 13 illustrates an electrical device, e.g., an integrated circuit similar to that illustrated in FIG. 5, encapsulated in a voltage variable housing.
FIG. 14 is a schematic diagram illustrating the electrical relationship between the voltage variable material and the electrical device or circuit to be protected from EOS transients.

Referring to FIG. 14, it should be understood by those of ordinary skill in the art that in the present invention, voltage variable materials 10 shall be applied between the conductor 20 to which the EOS transient may be applied and the ground reference 30 of the conductor 20.

Figure 3:
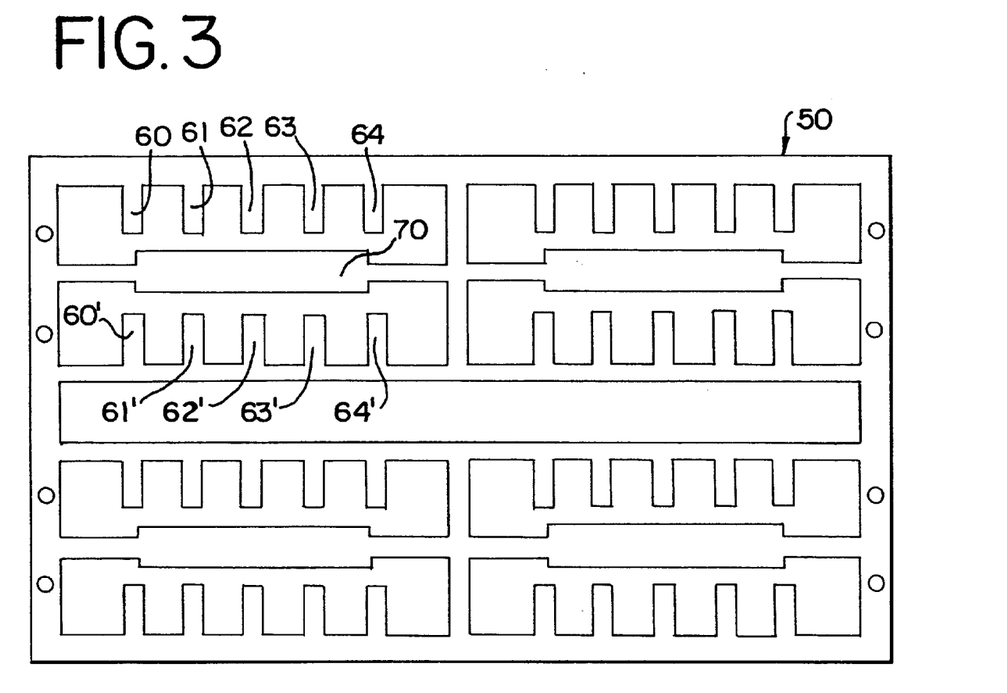
FIG. 3 illustrates a typical lead frame utilized in the manufacture of integrated circuits.
Figure 4:
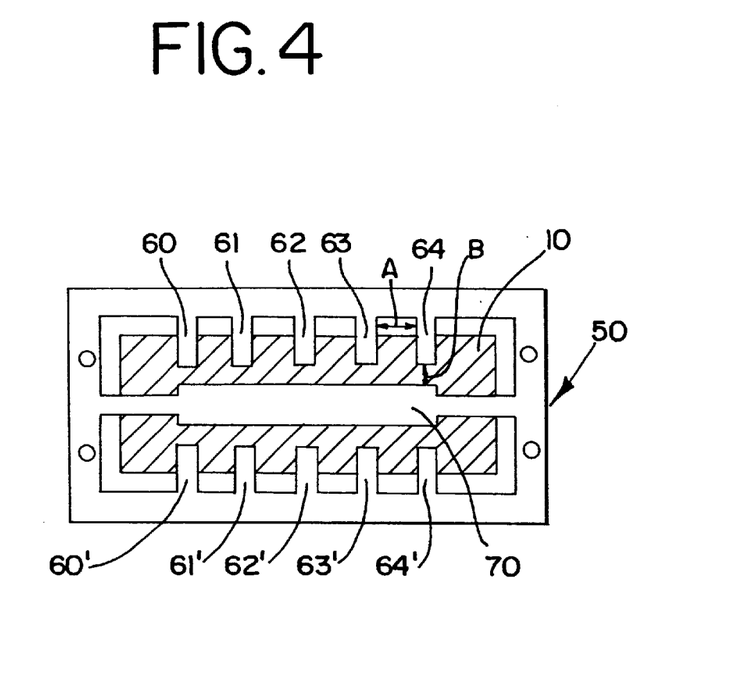
FIG. 4 illustrates a portion of the lead frame illustrated in FIG. 3 with a voltage variable material laminated to fill the spacing between the plurality of electrical leads and the ground plane.
Figure 5:
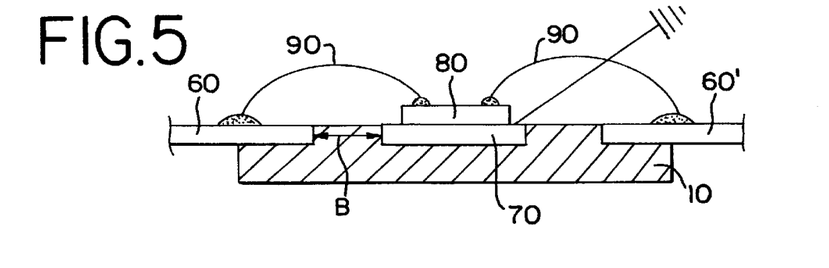
FIG. 5 illustrates a cross-sectional view of an electrical device according to one embodiment of the present invention.
Figure 6A:
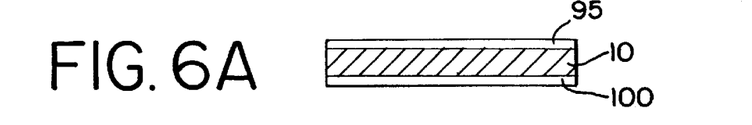
FIGS. 6A–6D illustrate various steps for manufacturing an electrical device according to another embodiment of the present invention.
Figure 6B:
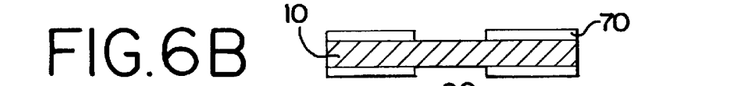
Figure 6C:
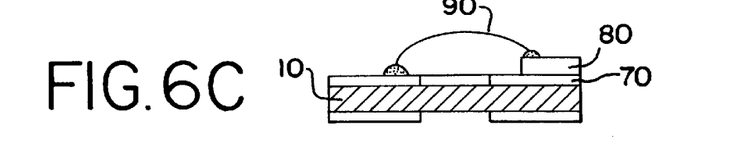
Figure 6D:
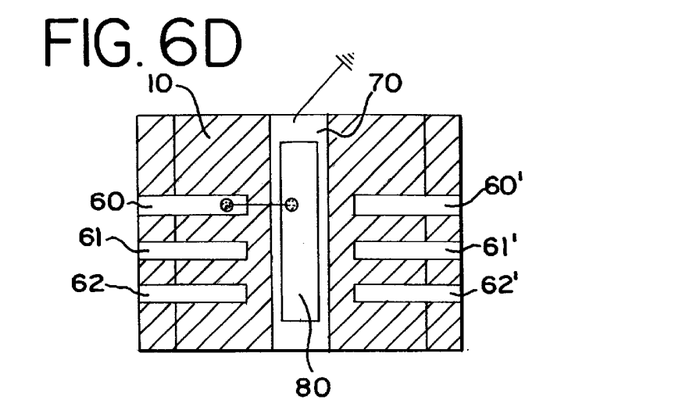

With reference now to FIGS. 3–5, a voltage variable material 10 is applied to a lead frame 50 comprised of a plurality of electrical leads 60,60' 61,61' 62,62' 63,63' 64, 64' . . . (60,60', etc.) and a ground plane 70. Each electrical lead is spaced apart from the other electrical leads by a predetermined dimension A. The ground plane 70 is adjacent to and spaced apart from corresponding electrical leads 60,60', etc. (e.g., ground plane 70 is interposed between leads 60 and 60') by a predetermined dimension B. A layer of voltage variable material 10 fills the space between the plurality of electrical leads 60,60', etc., and the space between the plurality of electrical leads 60,60', etc. and the ground plane 70. The layer of voltage variable material 10 physically connects the leads to the ground plane 70.

As shown in FIG. 5, a die or chip having an electrical circuit integrated therein (as is commonly known in the art) 80 is attached to the ground plane 70. Conductive members 90 (e.g., wires, conductive traces) electrically connect the plurality of leads 60,60', etc. to the integrated circuit. In a preferred embodiment (not shown) the plurality of electrical leads 60,60', etc., the ground plane 70, integrated circuit 80 and conductive members 90 are encapsulated in a protective, preferably insulative, housing. A portion of each of the plurality of electrical leads 60,60', etc. is exposed from the protective housing, i.e., extend outwardly from the protective housing, and form a plurality of connector pins 160, 160', 161,161', 162,162' . . . etc. (See FIG. 13 wherein the protective housing 170 is formed from a voltage variable material 10).

In one embodiment of the present invention, the predetermined dimension, A, (i.e., the spacing between each of the plurality of electrical leads) is greater than the predetermined dimension, B, (i.e., the spacing between each of the plurality of electrical leads and the ground plane). Thus, when an EOS transient is applied to the electrical leads 60,60', etc. and the voltage variable material 10 switches to its low resistance "on-state," the resistance of the material 10 in the direction between the leads 60,60', etc. and the ground plane 70 will be less than the resistance of the material 10 in the direction between the electrical leads 60,60', etc. Accordingly, the EOS transient will be channeled to the ground plane 70, and away from the integrated circuit 80.

The electrical device illustrated in FIGS. 3–5 is manufactured by providing a lead frame 50 having a plurality of electrical leads 60,60', etc. and a ground plane 70. As discussed above, there is a predetermined spacing, A, between the leads 60,60', etc. and a predetermined spacing, B, between the leads 60,60', etc. and the ground plane 70. A voltage variable material 10 is applied to lead frame 50, physically connecting the plurality of electrical leads 60,60', etc. to the ground plane 70. Preferably, the voltage variable material 10 is applied to the lead frame 50 by laminating a thin film of the material 10 on the lead frame 50. Alternatively, the material 10 may be applied by any conventional method (e.g., brushing, spraying, extruding). As shown in FIG. 4, during the lamination process the voltage variable material 10 fills the spacing, A, between the electrical leads 60,60', etc. and the spacing, B, between the electrical leads 60,60', etc. and the ground plane 70. A die or chip having electronic circuitry (e.g., integrated circuit or a discrete electronic component) 80 electrically connected thereto is attached to the ground plane 70. The die or chip 80 can be attached to the ground plane 70 before or after the lamination step. It is preferred, however, to attach the die or chip 80 to the ground plane 70 after the lamination step since the layer of voltage variable material 10 increases the structural integrity of the device, making the device easier to process.

The plurality of electrical leads 60,60', etc. are electrically connected, preferably by wire bonding 90, to the electronic circuitry on the die or chip 80. In the next step, the plurality of electrical leads 60,60', etc. and the ground plane 70 are removed or trimmed from the lead frame 50 to form the electrical device. Preferably, the electrical device is encapsulated in a protective, insulative housing, leaving a portion of the leads exposed. Finally, the exposed portions of the leads are formed into a plurality of connector pins for electrically connecting the device to a power supply.

Referring to FIGS. 6A–6D, an electrical device according to another embodiment of the present invention may be made by forming a circuit directly on the surface of a thin film or tape-like configuration of voltage variable material 10. Initial first and second electrodes 95,100 are attached to first and second surfaces of the material 10. The electrodes 95,100 may be composed of a metallic foil or a conductive layer (e.g., silver or copper plating). Portions of the electrodes 95,100 are masked and the exposed portions of the electrodes are etched away, leaving behind the desired lead and ground plane 70 geometry. Alternatively, the desired circuit geometry may be formed by applying a photoimagable material to the electrodes 95,100, applying a photo resist material in a desired pattern, developing the photo resist material, removing the non-developed photo resist material, and etching away the exposed portions of the electrodes 95,100 to create a plurality of electrical leads 60,60', etc. and a ground plane 70 on the voltage variable material 10 (See FIG. 6D). This process is more fully described in U.S. Pat. No. 5,669,607, the teaching of which is incorporated herein by reference.

The voltage variable material 10 is then cured. Pressure is than applied to the laminate (i.e., the layer of voltage variable material 10 with the leads 60,60', etc. and ground plane 70 formed on either: (i) the first surface of the voltage variable material 10; (ii) the second surface of the voltage variable material 10; or, (iii) both the first and second surfaces of the voltage variable material 10) so that the voltage variable material fills the areas between the leads 60,60', etc. and the ground plane 70 where portions of the electrode have been removed. FIGS. 6A–6D illustrate the embodiment wherein the leads 60,60', etc. and the ground plane have been formed on both the first and second surfaces of the voltage variable material 10. As a result of the pressure applied to the voltage variable material 10, the material 10 fills the spacing, A, (i.e., the spacing between the plurality of leads 60,60', etc.) and the spacing, B, (i.e., the spacing between the leads 60,60', etc. and the ground plane 70). The curing and pressurizing steps may be accomplished in a single step by placing the laminate in a heated press.

Figure 7:
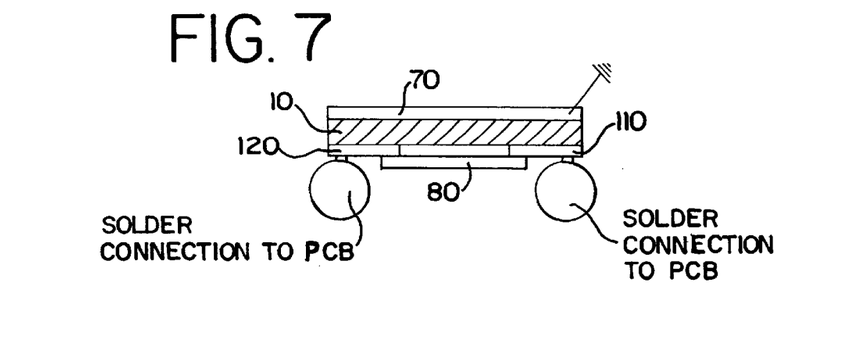
FIG. 7 illustrates an alternative embodiment of the electrical device shown in FIGS. 6A–6D.

In an alternative embodiment to the device disclosed in FIGS. 6A–6D, a discrete, surface-mountable device is illustrated in FIG. 7. A first conductive layer forms a ground plane 70 on a first surface of the voltage variable material 10. First and second conductive terminal pads 110,120 are disposed on a second surface of the voltage variable material 10. A die having electrical circuitry attached thereto 80 is electrically connected to the first and second conductive terminal pads 110,120. As shown in FIG. 7, the conductive terminal pads 110,120 can be electrically connected via solder or the like to a trace on a conventional printed circuit board.

Figure 8A:
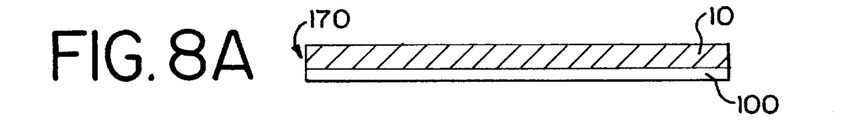
FIGS. 8A–8B illustrate a voltage variable tape and the application of the tape to an electrical device to provide protection against EOS transients.
Figure 8B:
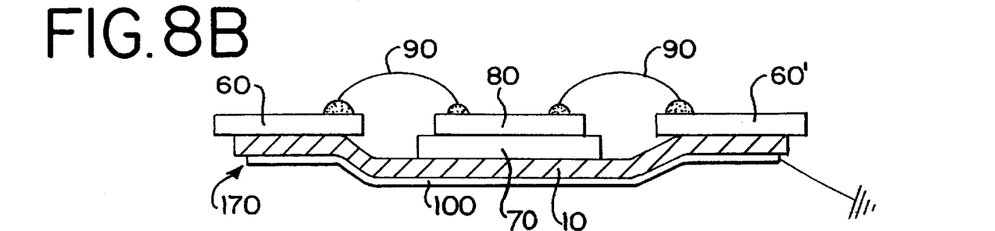

Referring now to FIGS. 8A–8B, in another embodiment of the voltage variable tape-like configuration illustrated in FIGS. 6A–6D, a conductive layer 100 is applied to a first surface of the thin film voltage variable material 10 to form the tape. The opposite surface of the voltage variable material 10 is bonded to a lead frame 50 comprising a plurality of electrical leads 60,60', etc. a ground plane 70 and a die or chip having electronic circuitry attached thereto 80. The voltage variable material 10 physically connects the ground plane 70 and the plurality of electrical leads 60,60', etc. The leads 60,60', etc. in turn are electrically connected to the circuitry attached to the die 80 by conductive members 90.

Figure 9A:
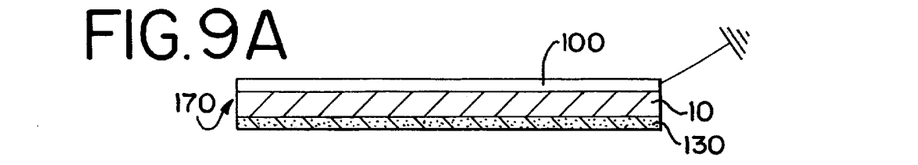
FIG. 9A illustrates the voltage variable tape of FIG. 8A with a conductive adhesive applied to one side.
Figure 9B:
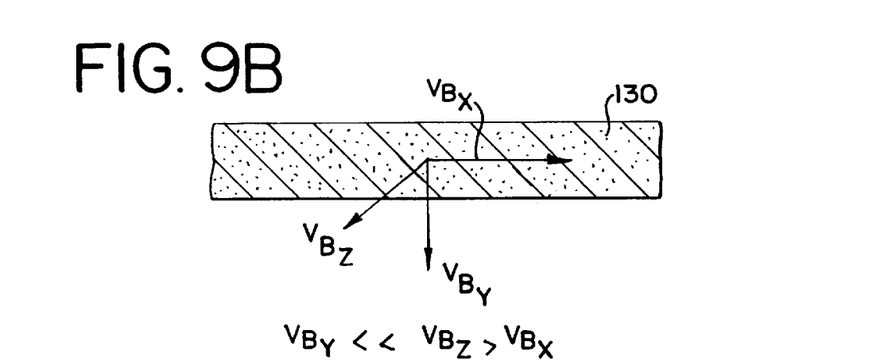
FIG. 9B illustrates the anisotropic voltage breakdown characteristics of the conductive adhesive illustrated in FIG. 9A.
Figure 10:
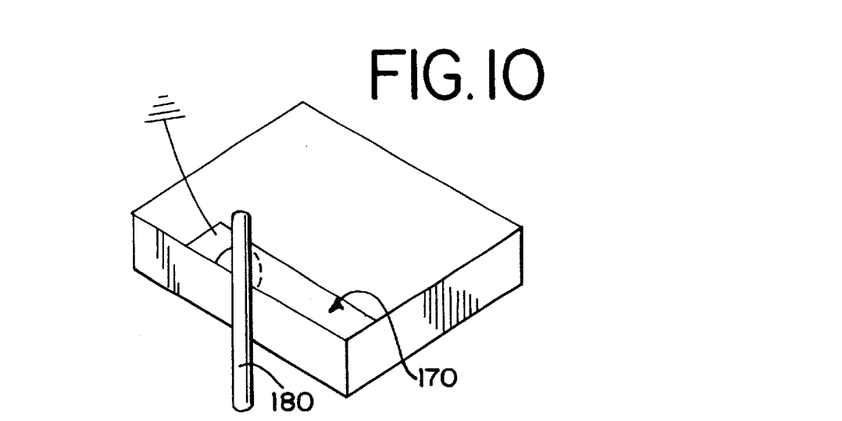
FIG. 10 illustrates the application of the voltage variable tape of either FIGS. 8A or 9A applied to a pin-style electrical connection of an electrical device to a conductive trace on a printed circuit board.

Yet another embodiment of the voltage variable tape-like configuration is disclosed in FIGS. 9A, 9B and 10. A conductive adhesive 130 is applied to one surface of the voltage variable material 10. A conductive layer 100 is applied to a second surface of the material 10. The conductive adhesive 130 has an anisotropic voltage breakdown. With reference to FIG. 9B, the voltage breakdown, $V_B$, of the conductive adhesive 130 measured in the direction of potential current flow through the conductive adhesive 130 (in most applications generally perpendicular to the layer of voltage variable material 10, e.g., $V_{By}$) is less than the voltage breakdown measured in any other direction (e.g.,$V_{Bz}$ or $V_{Bx}$). When bonded to an object, for example a lead frame 50 or a pin-style connector 180 on a printed circuit board, the conductive adhesive 130 collapses to a very thin layer. FIG. 10 illustrates a tape 170 having such a conductive adhesive 130 applied to the pin connector 180 of an electrical device (not shown) electrically connected to a printed circuit board.

Figure 11:
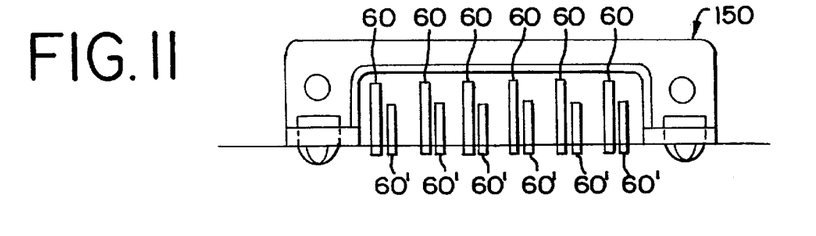
FIG. 11 illustrates a connector housing mounted on a printed circuit board.
Figure 12:
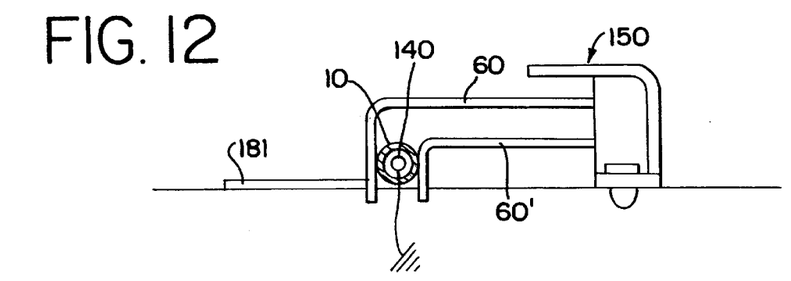
FIG. 12 illustrates the tape of FIG. 8A in the shape of a tube inserted between the connectors in the connector housing of FIG. 11 to provide protection against EOS transients.

It is common to have connector housings for electrical devices with a plurality of electrical leads 60,60', etc. to make electrical connections to conductive traces 181 on a printed circuit board. Electrical leads 60,60', etc. of the pin-type configuration (shown in FIGS. 10 and 11) are common in the personal computer (PC) industry and can be found in almost every PC. An example of such a connector housing 150 incorporating pin-type electrical leads 60,60', etc. is illustrated in FIG. 11. An external component such as a keyboard, printer, or monitor is commonly connected to a central processing unit in this manner. To protect such connectors from EOS transients, the present invention provides an electrical device comprised of a long hollow conductive tube 140 having an inner surface and an outer surface. A thin film of voltage variable material 10 is disposed on the outer surface of the tube 140. As shown in FIG. 12, the device is placed between a first set of a plurality of electrical leads 60 and a second set of a plurality of electrical leads 60'. The outer thin film layer of voltage variable material 10 is in electrical contact with both sets of leads 60,60' and the inner surface of the conductive tube 140 is electrically grounded.

Referring now to FIG. 13, the electrical device discussed above with respect to FIGS. 3–5 has a protective housing composed of a voltage variable material 10. Instead of an insulative, protective housing encapsulating a thin layer of voltage variable material 10 physically connecting the leads 60,60', etc. to the ground plane 70, the voltage variable material 10 is molded around and encapsulates: a portion of the plurality of electrical leads 60,60', etc.; the ground plane 70; and the die or chip having electronic circuitry attached thereto 80. The exposed portions of the electrical leads 60,60', etc. are further formed into a desired configuration (pin-style, flattened, etc.) to facilitate connection to another electrical component.

Figure 15:
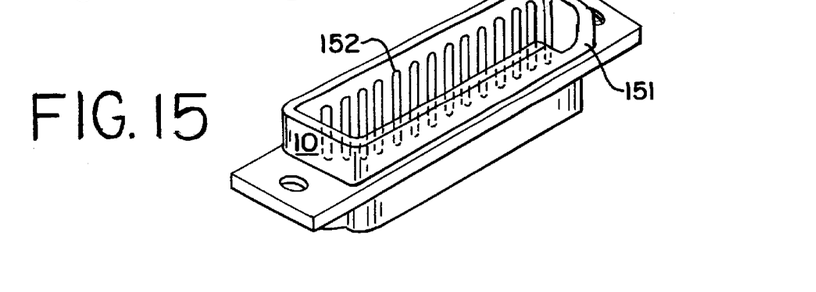
FIG. 15 illustrates an electrical connector housing formed from a voltage variable material.

In a further embodiment illustrated in FIG. 15, the housing 151 of an electrical connector housing 150 is comprised of a voltage variable material 10 to provide protection against EOS transients that may be applied to the electrical connectors 152.

While the specific embodiments have been illustrated and described, numerous modifications come to mind without significantly departing from the spirit of the invention and the scope of protection is only limited by the scope of the accompanying Claims.

We claim:

1. An electrical device for providing protection against EOS transients, the device comprising:

first and second rows of electrical leads, each electrical lead being spaced apart from other adjacent electrical leads in a respective row at least a distance A;

a ground plane positioned entirely between the first and second rows of electrical leads, the ground plane spaced from each of the electrical leads of the rows a distance B, the distance A being greater than the distance B; and a layer of voltage variable material filling at least part of the space between the plurality of electrical leads and the space between the electrical leads and the ground plane.

2. The electrical device of claim 1, further including a die with a circuit integrated therein attached to the ground plane, each of the plurality of electrical leads being electrically connected to the integrated circuit by a conductive member.

3. The electrical device of claim 2, wherein the electrical leads, the ground plane and the die are encapsulated in a protective housing.

4. The electrical device of claim 2, wherein a portion of the electrical leads and a portion of the ground plane extend outwardly from the protective housing.

5. The electrical device of claim 1, which includes a conductive adhesive disposed on a surface of the voltage variable material, the conductive adhesive having an anisotropic electrical conductance.

6. The electrical device of claim 5, wherein the electrical conductance measured in a direction generally perpendicular to the layer of voltage variable material is greater than an electrical conductance measured in any other direction.

7. The electrical device of claim 1, wherein the voltage variable material includes a polymeric composite voltage material.

8. An electrical device for providing protection against EOS transients, the device comprising:
   first and second coplanar rows of electrical leads, each electrical lead being spaced apart from each adjacent electrical lead in a respective row at least a distance A;
   a ground plane positioned coplanar with the first and second coplanar rows of electrical leads, the ground plane spaced from each of the electrical leads of the coplanar rows a distance B, the distance A being greater than the distance B; and
   a layer of voltage variable material filling at least part of the space between the plurality of electrical leads and the space between the electrical leads and the ground plane.

9. The electrical device of claim 8, further including a die with a circuit integrated therein attached to the ground plane, each of the plurality of electrical leads being electrically connected to the integrated circuit by a conductive member.

10. The electrical device of claim 9, wherein the electrical leads, the ground plane and the die are encapsulated in a protective housing.

11. The electrical device of claim 10 wherein a portion of the electrical leads and a portion of the ground plane extend outwardly from the protective housing.

12. The electrical device of claim 8, which includes a conductive adhesive disposed on a surface of the voltage variable material, the conductive adhesive having an anisotropic electrical conductance.

13. The electrical device of claim 12, wherein the electrical conductance of the conductive adhesive measured in a direction generally perpendicular to the layer of voltage variable material is greater than an electrical conductance measured in any other direction.

14. The electrical device of claim 8, wherein the voltage variable material includes a polymeric composite voltage material.

15. An electrical device for providing protection against EOS transients, the device made by steps comprising:
   providing first and second rows of electrical leads, each electrical lead being spaced apart from other adjacent electrical leads in a respective row at least a distance A, and a ground plane positioned entirely between the first and second rows of electrical leads, the ground plane spaced from each of the electrical leads of the rows a distance B, the distance A being greater than the distance B;
   providing a layer of voltage variable material ("VVM"); and
   filling at least part of the space between the plurality of electrical leads and the space between the electrical leads and the ground plane with at least part of the VVM layer.

16. The electrical device of claim 15, wherein filling at least part of the spaces includes laminating the VVM layer.

17. The electrical device of claim 15, wherein filling at least part of the spaces includes compressing the VVM layer.

18. The electrical device of claim 15, which is further made by providing a conductive adhesive on a surface of the VVM layer.

19. The electrical device of claim 15, which is further made by providing a conductive layer on a surface of the VVM layer, masking a portion of the conductive layer that forms the electrical leads and the ground plane and etching away the remaining portion of the conductive layer.

20. The electrical device of claim 15, which is further made by providing a conductive layer on a surface of the VVM layer, and etching away unwanted portions of the conductive layer using a photo-imageable material and a photoresist material.

* * * * *